(12) United States Patent
Gu et al.

(10) Patent No.: US 11,218,250 B2
(45) Date of Patent: Jan. 4, 2022

(54) INFORMATION ADDING METHOD AND APPARATUS

(71) Applicant: HUAWEI TECHNOLOGIES CO., LTD., Shenzhen (CN)

(72) Inventors: Jiaqi Gu, Shenzhen (CN); Hui Shen, Shenzhen (CN); Bin Li, Shenzhen (CN); Wen Tong, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 162 days.

(21) Appl. No.: 16/659,726

(22) Filed: Oct. 22, 2019

(65) Prior Publication Data
US 2020/0052818 A1 Feb. 13, 2020

Related U.S. Application Data

(63) Continuation of application No. PCT/CN2018/083111, filed on Apr. 13, 2018.

(30) Foreign Application Priority Data

Apr. 25, 2017 (CN) .......................... 201710277948.5

(51) Int. Cl.
*H04L 1/00* (2006.01)
*H04L 29/08* (2006.01)
(Continued)

(52) U.S. Cl.
CPC .......... *H04L 1/0061* (2013.01); *H04L 1/0041* (2013.01); *H04L 1/0071* (2013.01);
(Continued)

(58) Field of Classification Search
None
See application file for complete search history.

(56) References Cited

U.S. PATENT DOCUMENTS 10,149,318 B2 * 12/2018 Sun .................. H04J 11/004
2009/0041240 A1 * 2/2009 Parkvall ............... H04W 72/02
380/247
(Continued)

FOREIGN PATENT DOCUMENTS

CN 101374006 A 2/2009
CN 102055552 A 5/2011
(Continued)

OTHER PUBLICATIONS

U.S. Appl. No. 62/444,397; Hwang (Year: 2017).*
(Continued)

*Primary Examiner* — Andre Tacdiran
(74) *Attorney, Agent, or Firm* — Maier & Maier, PLLC

(57) ABSTRACT

An information adding method and apparatus, to increase a quantity of terminals that can be represented by an identifier sequence. The method includes: performing, by a transmit end, polar code encoding on a first bit sequence to generate an encoded second bit sequence; adding, by the transmit end, a part or all of an identifier sequence to the second bit sequence to generate a third bit sequence, where the identifier sequence is used to identify a terminal; and sending, by the transmit end, the third bit sequence.

16 Claims, 12 Drawing Sheets

(51) Int. Cl.
*H04W 72/04* (2009.01)
*H04W 72/12* (2009.01)
*H04W 76/11* (2018.01)
*H04L 29/12* (2006.01)

(52) U.S. Cl.
CPC ............ *H04L 61/30* (2013.01); *H04L 69/324* (2013.01); *H04W 72/042* (2013.01); *H04W 72/12* (2013.01); *H04W 76/11* (2018.02); *H04W 72/0466* (2013.01)

(56) References Cited

U.S. PATENT DOCUMENTS

| | | | |
|---|---|---|---|
| 2017/0013647 A1* | 1/2017 | Uchino | H04W 72/042 |
| 2017/0366199 A1* | 12/2017 | Ge | H04L 1/0053 |
| 2018/0048418 A1* | 2/2018 | Ge | H04L 1/0046 |
| 2018/0167946 A1* | 6/2018 | Si | H04L 5/00 |
| 2018/0198594 A1* | 7/2018 | Tiirola | H04W 74/006 |
| 2018/0199317 A1* | 7/2018 | Hwang | H04L 1/0041 |
| 2018/0206221 A1 | 7/2018 | Chen et al. | |
| 2018/0219606 A1* | 8/2018 | Ng | H04L 5/0053 |
| 2018/0255521 A1* | 9/2018 | Reial | H04W 56/001 |
| 2019/0393987 A1* | 12/2019 | Hong | H04L 1/0057 |
| 2020/0092880 A1* | 3/2020 | Choi | H04W 72/042 |

FOREIGN PATENT DOCUMENTS

| | | |
|---|---|---|
| CN | 104160772 A | 11/2014 |
| CN | 106535338 A | 3/2017 |
| CN | 106549726 A | 3/2017 |
| EP | 2795983 B1 | 4/2019 |
| WO | 2013/107409 A1 | 7/2013 |
| WO | 2019/195505 A1 | 10/2019 |

OTHER PUBLICATIONS

U.S. Appl. No. 62/454,108; Hong (Year: 2017).*
3GPP R1-1700324. 3GPP TSG RAN WG1 NR Ad-Hoc Meeting R1-1700324. AT&T (Year: 2017).*
3GPP R1-1701897. 3GPP TSG RAN WG1 Meeting #88. Coherent Logix (Year: 2017).*
Ge—U.S. Appl. No. 62/351,460 (Year: 2016).*
Ge—U.S. Appl. No. 62/372,872 (Year: 2016).*
Ge—U.S. Appl. No. 62/442,648 (Year: 2017).*
AT&T, "Attachment of UE-ID for common PDCCH", 3GPP TSG RAN WG1 Meeting #88bis, R1-1704350, Apr. 3-7, 2017, total 6 pages, Spokane, USA, XP051242500.
VIVO, "RNTI and CRC size for NR", 3GPP TSG RAN Meeting #88, R1-1703387, Feb. 13-17, 2017, total 4 pages, Athens, Greece, XP051210515.
ZTE et al., "Consideration on Polar Codes for NR", 3GPP TSG RAN WG1 #86bis, R1-1608975, Oct. 10-14, 2016, total 8 pages, Lisbon, Portugal.

* cited by examiner

INFORMATION ADDING METHOD AND APPARATUS

CROSS-REFERENCE TO RELATED APPLICATIONS

This application is a continuation of International Application No. PCT/CN2018/083111, filed on Apr. 13, 2018, which claims priority to Chinese Patent Application No. 201710277948.5, filed on Apr. 25, 2017, The disclosures of the aforementioned applications are hereby incorporated by reference in their entireties.

TECHNICAL FIELD

Embodiments relate to the field of communications technologies, and in particular, to an information adding method and apparatus.

BACKGROUND

In a wireless network communications system, when scheduling terminals, a base station usually identifies different terminals by using an identifier sequence, and the base station sends scheduling information by scrambling the identifier sequence.

For example, in a long term evolution (LTE) system, a common identifier sequence is a radio network temporary identifier (RNTI) sequence. An existing RNTI sequence has a length of 16 bits. As shown in FIG. 1, during physical downlink control channel (PDCCH) encoding, first, a base station performs 16-bit cyclic redundancy check (CRC) encoding on to-be-sent downlink control information (DCI), and information obtained after the encoding includes the DCI information and 16-bit CRC information. Then, the base station performs an exclusive OR (XOR) operation (namely, a scrambling operation) on 16-bit RNTI information and the 16-bit CRC information, to obtain RNTI-scrambled 16-bit CRC information, serially cascades the RNTI-scrambled 16-bit CRC information to the DCI information, and performs channel encoding, modulation, mapping, and sending.

In a 5th generation (5G) communications system and more possible future communications systems, massive machine type communications (mMTC) require wide coverage and massive access. If the foregoing manner of scrambling CRC bits by using an RNTI in the existing system is used, because the length of the RNTI is limited to 16 bits, and the quantity of terminals that can be identified by using the 16-bit RNTI is only $2^{16}=65536$, the RNTI scrambling manner cannot necessarily meet a requirement of a future massive access scenario.

SUMMARY

Embodiments provide an information adding method and apparatus, to resolve a problem that an identifier sequence using an existing information adding manner can identify a relatively small quantity of terminals.

The technical solutions provided in the embodiments are as follows.

According to a first aspect, an information adding method is provided. An identifier sequence used to identify a terminal is added to an encoded polar code. It is assumed that a code length of the encoded polar code is N bits, where N is a positive integer, for example, optionally, N>16. Thus, a length of the identifier sequence may be extended to a maximum of N bits, and a quantity of terminals that can be identified by an N-bit identifier sequence is increased to $2^N$.

In a possible embodiment, a bit sequence that has not been encoded is recorded as a first bit sequence. A transmit end performs polar code encoding on the first bit sequence, to generate an encoded second bit sequence. The transmit end adds a part or all of an identifier sequence to the second bit sequence, to generate a third bit sequence. The transmit end sends the third bit sequence. The identifier sequence is used to identify a terminal. Therefore, adding the identifier sequence to the encoded bit sequence can ensure that a value, at each fixed bit location, of a polar code that has not been encoded remains 0, thereby ensuring low hardware overheads, and resolve a problem of an insufficient length of an identifier sequence in an existing system. A length of the identifier sequence is increased, so that a quantity of terminals that can be identified by the identifier sequence is also increased, thereby better meeting a requirement of a future massive access scenario.

Optionally, the identifier sequence is an RNTI sequence.

Optionally, the identifier sequence is a sequence number of a terminal or a group number of a terminal group.

In a possible embodiment, that the transmit end adds a part or all of an identifier sequence to the second bit sequence, to generate a third bit sequence may be implemented in the following manner: The transmit end performs a scrambling operation on the second bit sequence by using the part or all of the identifier sequence, to generate the third bit sequence.

In a possible embodiment, the transmit end performs the scrambling operation on a part or all of the second bit sequence by using the part or all of the identifier sequence. Optionally, the part of the second bit sequence may be selected in any manner based on an actual requirement. Therefore, the length of the identifier sequence can be more flexible and controllable, and a location of a scrambled bit can be determined more based on an actual requirement.

In a possible embodiment, where the transmit end performs a scrambling operation on the second bit sequence by using the part or all of the identifier sequence may be implemented in the following manner: The transmit end scrambles the second bit sequence by using the part or all of the identifier sequence based on a specified mapping relationship.

In a possible embodiment, the transmit end sequentially scrambles the second bit sequence by using the part or all of the identifier sequence through several repetitions.

In a possible embodiment, in addition to the scrambling, the transmit end may further perform an interleaving operation on the second bit sequence in interleaving mode, to generate the third bit sequence, where the interleaving mode is determined by the part or all of the identifier sequence. In this way, the third bit sequence may also be considered as carrying the identifier sequence.

In a possible embodiment, before the transmit end performs polar code encoding on the first bit sequence, the transmit end obtains to-be-encoded information bits, and performs check encoding on the information bits, to obtain check bits; adds all of the identifier sequence to the check bits, or adds a first part of the identifier sequence to the check bits; and generates the first bit sequence based on the information bits and the check bits carrying the identifier sequence. Optionally, the check encoding may be CRC check encoding or PC check encoding.

In a possible embodiment, if the transmit end adds the first part of the identifier sequence to the check bits, the transmit end adds a second part of the identifier sequence to the second bit sequence, where the first part differs from the second part, or the first part and the second part have an intersection set.

According to a second aspect, an information adding method is provided. A receive end obtains a to-be-decoded sequence. The receive end performs a descrambling operation on the to-be-decoded sequence by using a part or all of an identifier sequence, or the receive end performs a de-interleaving operation on the to-be-decoded sequence in interleaving mode, where the interleaving mode is determined by the part or all of the identifier sequence, and the identifier sequence is used to identify a terminal. The receive end performs polar code decoding on a sequence obtained after the descrambling operation or the de-interleaving operation. This helps resolve a problem of an insufficient length of an identifier sequence in an existing system. The length of the identifier sequence is increased, so that the quantity of terminals that can be identified by the identifier sequence is also increased, thereby better meeting a requirement of a future massive access scenario.

In a possible embodiment, the receive end performs the descrambling operation on a part or all of the to-be-decoded sequence by using the part or all of the identifier sequence.

In a possible embodiment, the receive end performs, based on a specified mapping relationship, the descrambling operation on the to-be-decoded sequence by using the part or all of the identifier sequence.

In a possible embodiment, the receive end sequentially performs, through several repetitions, the descrambling operation on the to-be-decoded sequence by using the part or all of the identifier sequence.

In a possible embodiment, after the receive end performs polar code decoding on a sequence obtained after the descrambling operation or the de-interleaving operation, the receive end extracts check bits from the decoded sequence, and performs a descrambling operation on the check bits by using the part or all of the identifier sequence.

According to a third aspect, an information adding apparatus is provided. The apparatus has a function for implementing behavior of the transmit end according to any one of the first aspect or the possible embodiments of the first aspect. The function may be implemented by hardware, or may be implemented by hardware executing corresponding software. The hardware or software includes one or more modules corresponding to the foregoing function.

According to a fourth aspect, an information adding apparatus is provided. The apparatus has a function for implementing behavior of the receive end according to any one of the second aspect or the possible embodiments of the second aspect. The function may be implemented by hardware, or may be implemented by hardware executing corresponding software. The hardware or software includes one or more modules corresponding to the foregoing function.

According to a fifth aspect, an information adding apparatus is provided. A structure of the information adding apparatus includes a transceiver and a processor. The processor is configured to instruct a group of programs to perform the method according to any one of the first aspect or the possible embodiments of the first aspect. Optionally, the structure of the information adding apparatus further includes a memory, configured to store the programs instructed by the processor.

According to a sixth aspect, an information adding apparatus is provided. A structure of the information adding apparatus includes a transceiver and a processor. The processor is configured to instruct a group of programs to perform the method according to any one of the second aspect or the possible embodiments of the second aspect. Optionally, the structure of the information adding apparatus further includes a memory, configured to store the programs instructed by the processor.

According to a seventh aspect, a communications system is provided. The system includes the apparatus according to the third aspect or the fifth aspect and the apparatus according to the fourth aspect or the sixth aspect.

According to an eighth aspect, a computer storage medium is provided. The computer storage medium is configured to store a computer program. The computer program includes an instruction used to perform the method according to any one of the first aspect, the second aspect, the possible implementations of the first aspect, or the possible implementations of the second aspect.

According to a ninth aspect, an embodiment provides a computer program product including an instruction. When the computer program product is run on a computer, the computer is enabled to perform the methods according to the foregoing aspects.

DESCRIPTION OF EMBODIMENTS

The following describes in detail the embodiments with reference to accompanying drawings.

A polar code encoding scheme features high performance, relatively low complexity, flexible matching, and the like, and has been determined as a control channel encoding scheme in a 5th generation (5G) communications system by the 3rd generation partnership project (3GPP). The embodiments provide an information adding method and apparatus. An identifier sequence used to identify a terminal is added to an encoded polar code. It is assumed that a code length of the encoded polar code is N bits, where N is a positive integer. Compared with LTE, in which 16 CRC bits are scrambled by using a PDCCH identifier sequence, in the embodiments a length of the carried identifier sequence is not limited to 16 bits. The length of the identifier sequence may be extended to a maximum of N bits, and the quantity of terminals that can be identified by the N-bit identifier sequence is increased to $2^N$. According to the solutions in the embodiments, a polar code has low hardware overheads, thereby resolving a problem of an insufficient length of an identifier sequence in an existing system. The length of the identifier sequence is increased, so that the quantity of terminals that can be identified by the identifier sequence is also increased, thereby better meeting a requirement of a future massive access scenario. It should be noted that the solutions in the embodiments are described with reference to an example of a polar code encoding scheme, but the method provided in the embodiments may be further applied to other encoding schemes such as a low-density parity-check code (LDPC) encoding scheme and a turbo code encoding scheme. Provided that an encoded code word is used to carry the identifier sequence, the encoding schemes shall fall within the protection scope of the embodiments.

To better understand the solutions in the embodiments, the following briefly describes the polar code channel encoding scheme.

The polar code encoding scheme may be represented by using the following formula: $x = u \cdot F_n$, where u is an N-bit binary vector, and $F_n$ is Kronecker power transformation matrix, and is also a polar code encoding matrix.

$$F_n = \begin{bmatrix} 1 & 0 \\ 1 & 1 \end{bmatrix}^{\otimes n},$$

and is a product of 2×2 matrices $$\begin{bmatrix} 1 & 0 \\ 1 & 1 \end{bmatrix}.$$

Figure 1:
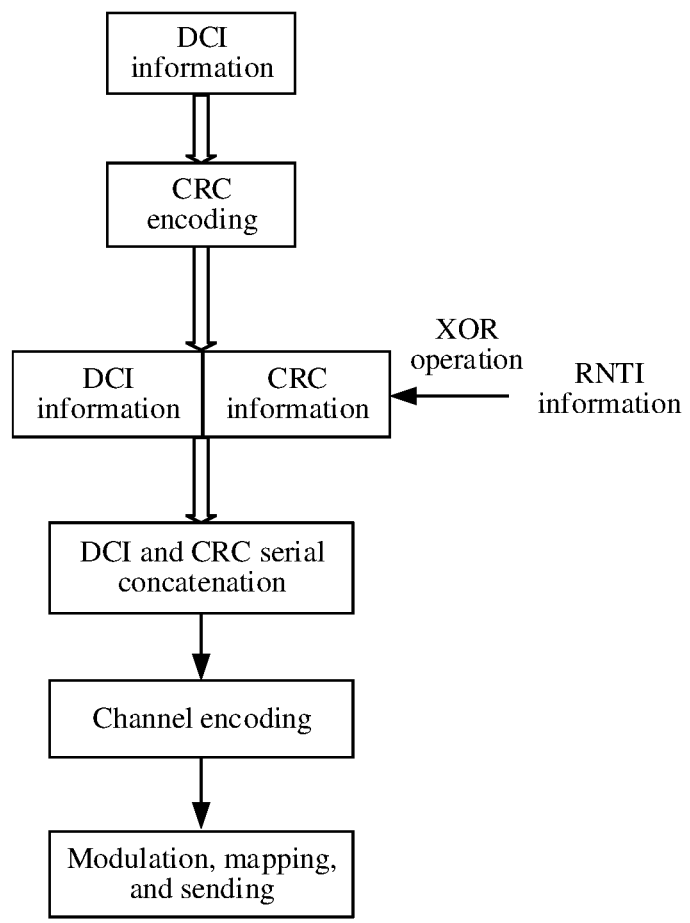
FIG. 1 is a schematic diagram of a PDCCH encoding process according to the prior art.
Figure 2:
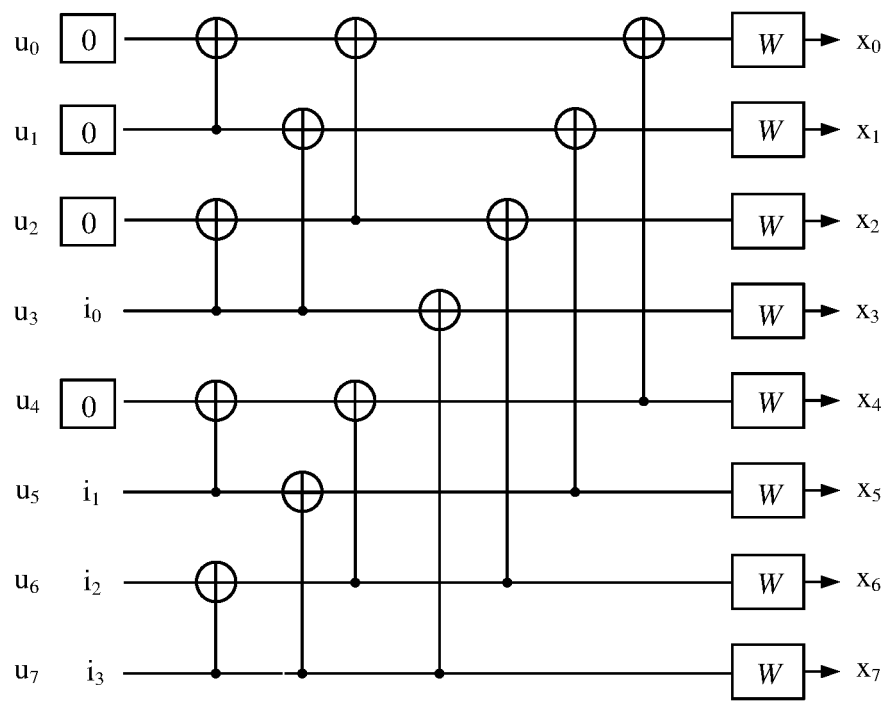
FIG. 2 is a schematic diagram of a polar code encoding scheme according to an embodiment.

FIG. 2 shows an 8×8 encoding matrix. The vector u is represented by using $(0, 0, 0, U_3, 0, U_5, U_6, U_7)$, and bits encoded by using the encoding matrix are represented by using a vector $(X_0, X_1, X_2, X_3, X_4, X_5, X_6, X_7)$. At a transmit end, a polarization phenomenon occurs through polar code encoding, so that some bits in the vector u are transmitted through an equivalent high-reliability channel, and the other bits are transmitted through an equivalent low-reliability channel. At a receive end, decoding is usually performed in a bit-by-bit successive-cancellation (SC) manner. For example, some bits in the vector u pass through an equivalent high-reliability channel and are correctly decoded with a high probability, and the other bits pass through an equivalent low-reliability channel and are correctly decoded with a low probability. Generally, a high-reliability channel is used to transmit an information bit, and a bit corresponding to a low-reliability channel is frozen. For example, a location of the frozen bit may be set to 0, and no valid data is transmitted at the location. As shown in FIG. 2, $\{u_0, u_1, u_2, u_4\}$ are set as locations of frozen bits, $\{u_3, u_5, u_6, u_7\}$ are set as locations of information bits, and a 4-bit information vector $\{i_0, i_1, i_2, i_3\}$ is encoded to generate an 8-bit encoded bit sequence.

In the embodiments, after the foregoing encoding, the identifier sequence used to identify the terminal is added to the encoded bit sequence. The encoded bit sequence carrying the identifier sequence is modulated, then passes through a noise channel, and then is output.

Figure 3:
FIG. 3 is a schematic diagram of a system architecture according to an embodiment.

As shown in FIG. 3, a system architecture to which the embodiments are applied includes a transmit end 301 and a receive end 302. The transmit end 301 may be a base station, and the receive end 302 is a terminal. Alternatively, the transmit end 301 is a terminal, and the receive end 302 is a base station. The base station is an apparatus that is deployed in a radio access network and that is configured to provide a wireless communication function for the terminal. The base station may include macro base stations, micro base stations, relay stations, access points, and the like in various forms, and may be applied to systems using different radio access technologies, for example, an LTE system, a 5G communications system, or other possible communications systems. The base station may further be another network device having a base station function, and, may further be a terminal serving as a base station in device-to-device (D2D) communication. The terminal may include various handheld devices, in-vehicle devices, wearable devices, and computing devices that have a wireless communication function or other processing devices connected to a wireless modem, and user equipment, mobile station, and the like in various forms.

In the embodiments, an identifier sequence is used by the base station to identify different terminals. For example, the identifier sequence may be an RNTI sequence, a sequence number of a terminal, a group number of a terminal group, or the like. Without loss of generality, the RNTI is used as an example for description.

Figure 4:
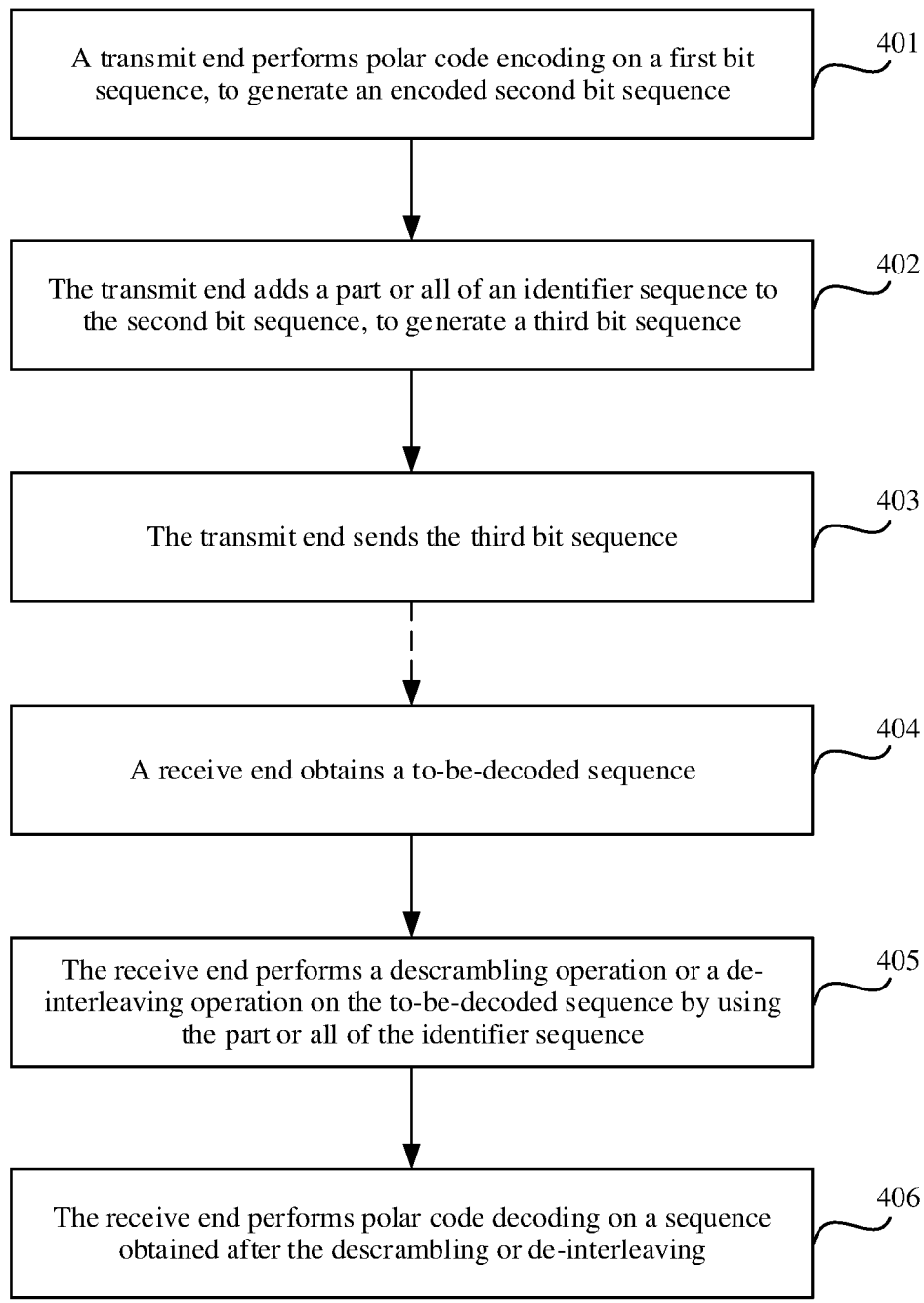
FIG. 4 is a schematic diagram of an exemplary procedure of an information adding method according to an embodiment.

Based on the system architecture shown in FIG. 3, as shown in FIG. 4, in an embodiment, an exemplary procedure of an information adding method is as follows.

In step 401, the transmit end performs polar code encoding on a first bit sequence, to generate an encoded second bit sequence.

In a possible implementation, the first bit sequence is a bit sequence obtained by the base station before the polar code encoding. The transmit end first obtains to-be-encoded information bits, and performs check encoding on the to-be-encoded information bits, to obtain check bits. The check bits may be used to carry an identifier sequence. Optionally, all of the identifier sequence is carried in the check bits, or a first part of the identifier sequence is carried in the check bits. The transmit end serially cascades the information bits and the check bits carrying all or a part of the identifier sequence, to generate the first bit sequence.

This embodiment does not limit a check encoding scheme. For example, the check encoding scheme may be CRC check scheme, where check bits are CRC bits, and all CRC bits are attached to the end of an information bit sequence. Alternatively, some CRC bits are inserted into an information bit sequence in a distributed manner, and some CRC bits are attached to the end of the information bit sequence. In another example, the check encoding scheme may be a parity check (PC) scheme, where PC bits are used in an information bit sequence, so that some information bits previous to the PC bits satisfy a check relationship, or the PC bits may alternatively be placed at the end of the information bit sequence. In another example, the check encoding scheme may be a hash check scheme.

In step 402, the transmit end adds a part or all of the identifier sequence to the second bit sequence, to generate a third bit sequence.

The second bit sequence may be a sequence on which rate matching is performed, or may be a sequence on which no rate matching is performed. If the second bit sequence is a sequence on which no rate matching is performed, after adding the part or all of the identifier sequence to the second bit sequence, the transmit end further needs to perform rate matching on the second bit sequence carrying the identifier sequence, to generate the third bit sequence.

For example, if the transmit end has already added all of the identifier sequence to the check bits, the transmit end may further add all of the identifier sequence to the second bit sequence.

For another example, the transmit end adds the first part of the identifier sequence to the check bits, and the transmit end adds a second part of the identifier sequence to the second bit sequence, where the first part differs from the second part, or the first part and the second part have an intersection set.

The identifier sequence may be added in, but not limited to, through scrambling and an interleaving operation.

If the identifier sequence is added through scrambling, the transmit end may perform a scrambling operation on a part or all of the second bit sequence by using the part or all of the identifier sequence. In addition, the scrambling manner may not be limited to directly performing an XOR operation. The transmit end may further scramble the second bit sequence by using the part or all of the identifier sequence based on a specified mapping relationship. For example, the transmit end sequentially scrambles the second bit sequence by using the part or all of the identifier sequence through several repetitions.

If the identifier sequence is added through the interleaving operation, the transmit end may determine an interleaving mode by using the part or all of the identifier sequence, and performs the interleaving operation on the second bit sequence in the generated interleaving mode, to generate the third bit sequence.

In step 401 and step 402, how the transmit end performs encoding and adds the identifier sequence are generally described. In the following steps, it is described that the receive end adds an identifier sequence in the same manner and then performs decoding.

In step 403, the transmit end sends the third bit sequence.

In step 404, a receive end obtains a to-be-decoded sequence.

In step 405, the receive end performs a descrambling operation on the to-be-decoded sequence by using the part or all of the identifier sequence; or the receive end performs a de-interleaving operation on the to-be-decoded sequence in interleaving mode, where the interleaving mode is determined by the part or all of the identifier sequence.

In step 406, the receive end performs polar code decoding on a sequence obtained after the descrambling operation or the de-interleaving operation.

Correspondingly, the receive end obtains the manner of adding the identifier sequence by the transmit end, and descrambles or de-interleaves the to-be-decoded sequence in a corresponding manner.

The receive end may perform the descrambling operation on a part or all of the to-be-decoded sequence by using the part or all of the identifier sequence.

The receive end performs, based on a specified mapping relationship, the descrambling operation on the to-be-decoded sequence by using the part or all of the identifier sequence. For example, the receive end sequentially performs, through several repetitions, the descrambling operation on the to-be-decoded sequence using the part or all of the identifier sequence.

Optionally, after performing the polar code decoding on the sequence obtained after the descrambling operation or the de-interleaving operation, the receive end extracts check bits from the decoded sequence, and performs a descrambling operation on the check bits by using the part or all of the identifier sequence.

In this embodiment, an encoded bit sequence is used to carry the identifier sequence, and when the encoded bit sequence has a length of N bits, the identifier sequence can carry a maximum of $2^N$ terminals, thereby greatly increasing the quantity of terminals that can be identified by the identifier sequence, and better meeting a requirement of a future massive access scenario. In addition, an effect of carrying the identifier sequence by using the encoded bit sequence in this embodiment is equivalent to that of carrying the identifier sequence by using a frozen bit that has not been encoded. However, if a bit sequence that has not been encoded is used to carry the identifier sequence, it cannot be ascertained that a value, at each fixed bit location, of a polar code that has not been encoded is 0, and relatively large hardware overheads are caused. Because the encoded bit sequence is used to carry the identifier sequence, a value, at a fixed bit location, of a polar code that has not been encoded can be ascertained to remain 0, thereby ensuring low hardware overheads.

Based on the information adding method shown in FIG. 4, the following further describes, with reference to an exemplary scenario, in detail the information adding method provided in this embodiment. It is assumed that the transmit end is a base station, the receive end is a terminal, the identifier sequence is an RNTI sequence, the information bit that has not been encoded is DCI, a check scheme is a CRC check scheme, a PDCCH is encoded by using a polar code encoding scheme, the encoded bit sequence has a length of N bits, the RNTI sequence has a length of T bits, and a CRC length is of 16 bits (the CRC bit quantity may alternatively be another value, and this is not limited herein).

Figure 5:
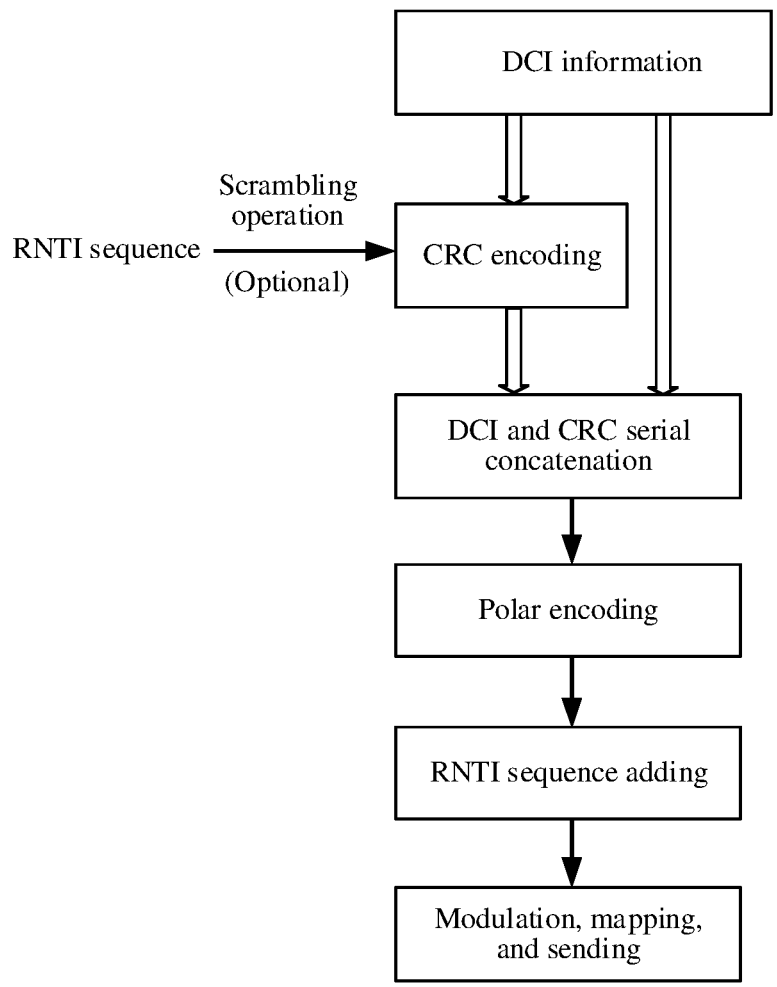
FIG. 5 is a schematic diagram of a PDCCH encoding process according to an embodiment.

As shown in FIG. 5, in a PDCCH encoding process, the base station first performs 16-bit CRC encoding on to-be-sent DCI information, to obtain 16 CRC bits. Optionally, the base station performs a scrambling operation on a part, having a length of 16 bits, of the RNTI sequence and the 16 CRC bits, to obtain 16 RNTI-scrambled CRC bits, and serially cascades the 16 RNTI-scrambled CRC bits to the foregoing DCI information. The base station may alternatively choose not to scramble the CRC bits by using the RNTI. The base station performs polar code encoding on a bit sequence generated after serial concatenation. The base station uses the encoded bit sequence to carry the RNTI sequence. The base station scrambles all of the RNTI sequence to the encoded bit sequence, or the base station scrambles another part, having a length of T=16 bits, of the RNTI sequence to the encoded bit sequence, or the base station scrambles a part, having a length of S bits, of the RNTI sequence to the encoded bit sequence. The part having the length of S bits partially overlaps the part having the length of 16 bits and includes the other part having the length of T=16 bits. If T is less than N, the base station may scramble the RNTI sequence to a part of the encoded bit sequence. If T is equal to N, the base station may scramble the RNTI sequence to all of the encoded bit sequence.

In addition, if T is equal to N, the base station may further generate a corresponding interleaving mode based on a specified function mapping relationship by using the RNTI sequence, and perform an interleaving operation on the encoded bit sequence with the interleaving mode.

Eventually, the base station performs a modulation, mapping, and sending procedure on the scrambled bit sequence or the interleaved bit sequence.

Figure 6:
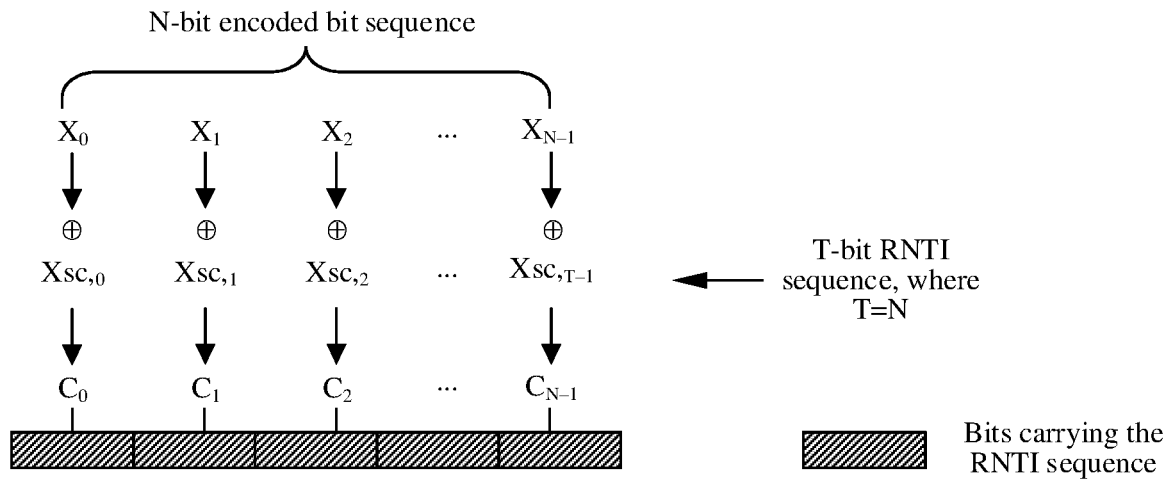
FIG. 6 is a first schematic diagram of an RNTI adding manner according to an embodiment.

For example, as shown in FIG. 6, T=N. The base station scrambles all of the RNTI sequence having a length of T bits to the encoded bit sequence. Optionally, the CRC bits may carry a part of the RNTI sequence. For example, the encoded bit sequence is $\{X0, X1, X2, \ldots, X_{N-1}\}$, and all of the RNTI sequence having the length of T bits is scrambled to $\{X0, X1, X2, \ldots, X_{N-1}\}$, to generate a sequence $\{C0, C1, C2, \ldots, C_{N-1}\}$. Thus, the encoded bit sequence can carry an N-bit RNTI sequence.

Figure 7A:
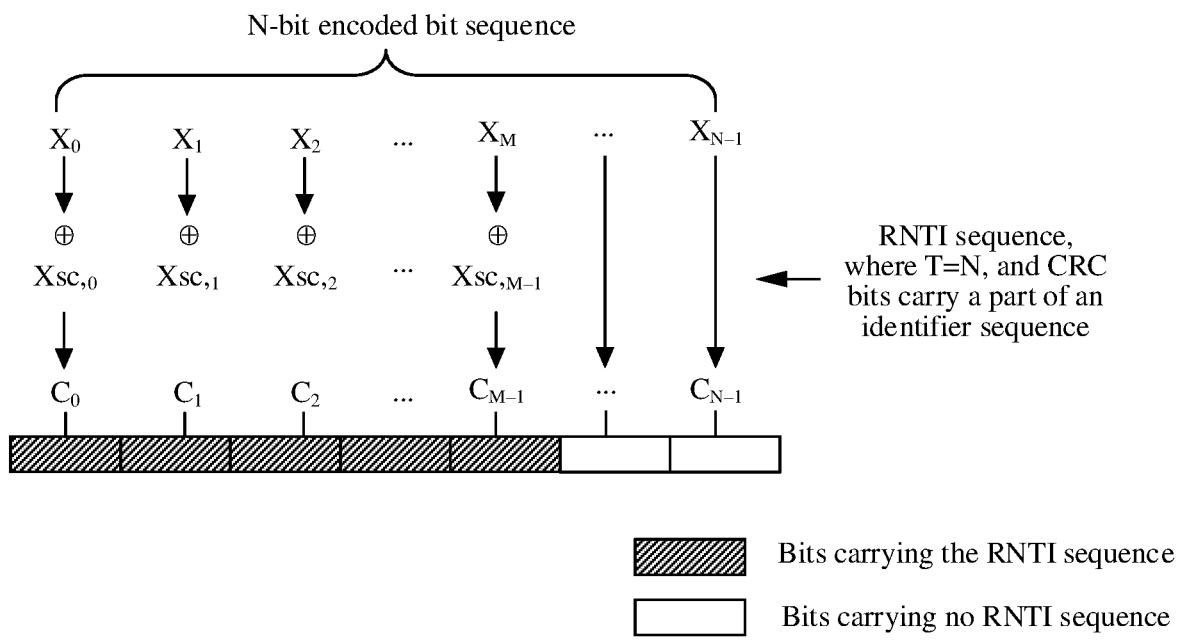
FIG. 7A is a second schematic diagram of an RNTI adding manner according to an embodiment.

As shown in FIG. 7A, T=N, and the CRC bits carry a part of the RNTI sequence. The base station scrambles another part of the RNTI sequence to a part of the encoded bit sequence. The another part of the RNTI sequence and the part of the RNTI sequence may differ from each other or have an intersection set. For example, the encoded bit sequence is $\{X_0, X_1, X_2, \ldots, X_M, \ldots, X_{N-1}\}$, where M is any value from 0 to N−1, and the RNTI sequence having a length of T bits is $\{Xsc_{,0}, Xsc_{,1}, Xsc_{,2}, \ldots, Xsc_{,T-1}\}$. Selecting some bit locations from $\{X_0, X_1, X_2, \ldots, X_{N-1}\}$ may be considered as selecting a sub-sequence. For example, first M consecutive bit locations are selected. That is, the sub-sequence is $\{Xsc_{,0}, Xsc_{,1}, Xsc_{,2}, \ldots, Xsc_{,M-1}\}$. The another part of the RNTI sequence is scrambled to the sub-sequence $\{Xsc_{,0}, Xsc_{,1}, Xsc_{,2}, \ldots, Xsc_{,M-1}\}$, to generate a sequence $\{C_0, C_1, C_2, \ldots, C_{N-1}\}$. The sequence $\{C_0, C_1, C_2, \ldots, C_{N-1}\}$ includes bits carrying the RNTI sequence and bits not carrying the RNTI sequence. Based on a requirement, any bit locations may be selected from $\{X_0, X_1, X_2, \ldots, X_{N-1}\}$. When some bit locations are selected from $\{X_0, X_1, X_2, \ldots, X_{N-1}\}$, first M information bit locations may also be selected. In this way, the length of the RNTI sequence can be flexibly extended, and appropriate bit locations can be flexibly selected to carry the RNTI sequence.

Figure 7B:
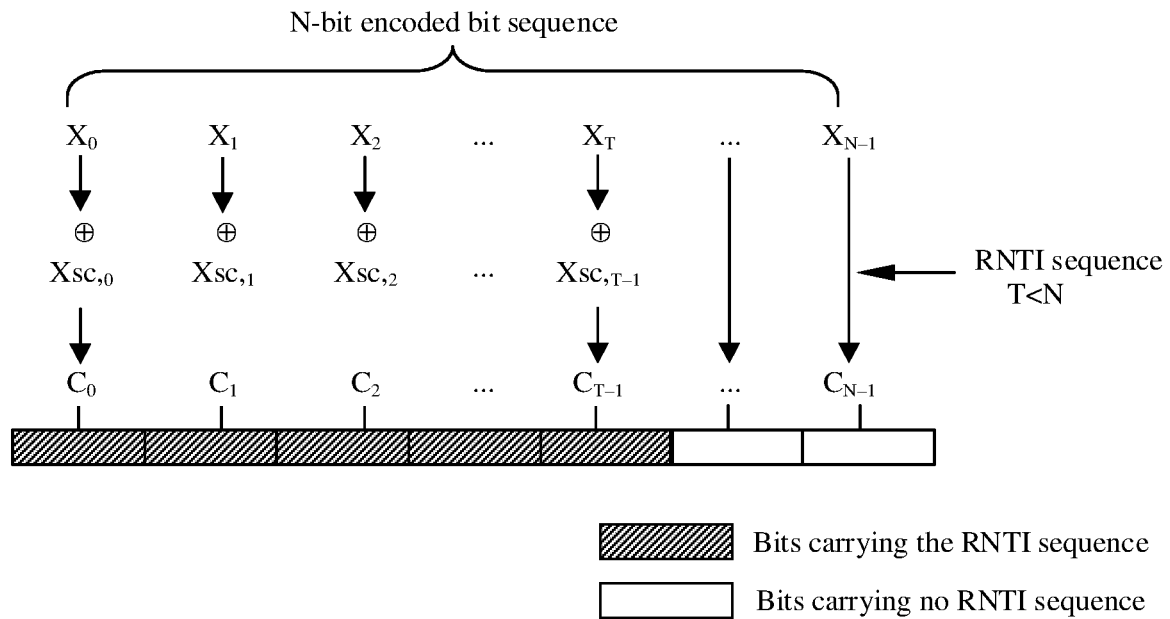
FIG. 7B is a third schematic diagram of an RNTI adding manner according to an embodiment.

As shown in FIG. 7B, T<N. The base station scrambles the RNTI sequence having a length of T bits to a part of the encoded bit sequence. Optionally, the CRC bits may carry a part of the RNTI sequence. For example, the encoded bit sequence is $\{X0, X1, X2, \ldots, X_T, \ldots, X_{N-1}\}$, and the RNTI sequence having the length of T bits is $\{Xsc_{,0}, Xsc_{,1}, Xsc_{,2}, \ldots, Xsc_{,T-1}\}$. Some bit locations are selected from $\{X_0, X_1, X_2, \ldots, X_{N-1}\}$. For example, the first T consecutive bit locations are selected. All of the RNTI sequence having the length of T bits is scrambled to the selected bit locations, to generate a sequence $\{C_0, C_1, C_2, \ldots, C_{N-1}\}$. The sequence $\{C_0, C_1, C_2, \ldots, C_{N-1}\}$ includes bits carrying the RNTI sequence and bits not carrying the RNTI sequence. Based on a requirement, any bit locations may be selected from $\{X_0, X_1, X_2, \ldots, X_{N-1}\}$. When some bit locations are selected from $\{X_0, X_1, X_2, \ldots, X_{N-1}\}$, first T information bit locations may also be selected. Thus, the length of the RNTI sequence can be flexibly extended, and appropriate bit locations can be flexibly selected to carry the RNTI sequence.

Figure 8A:
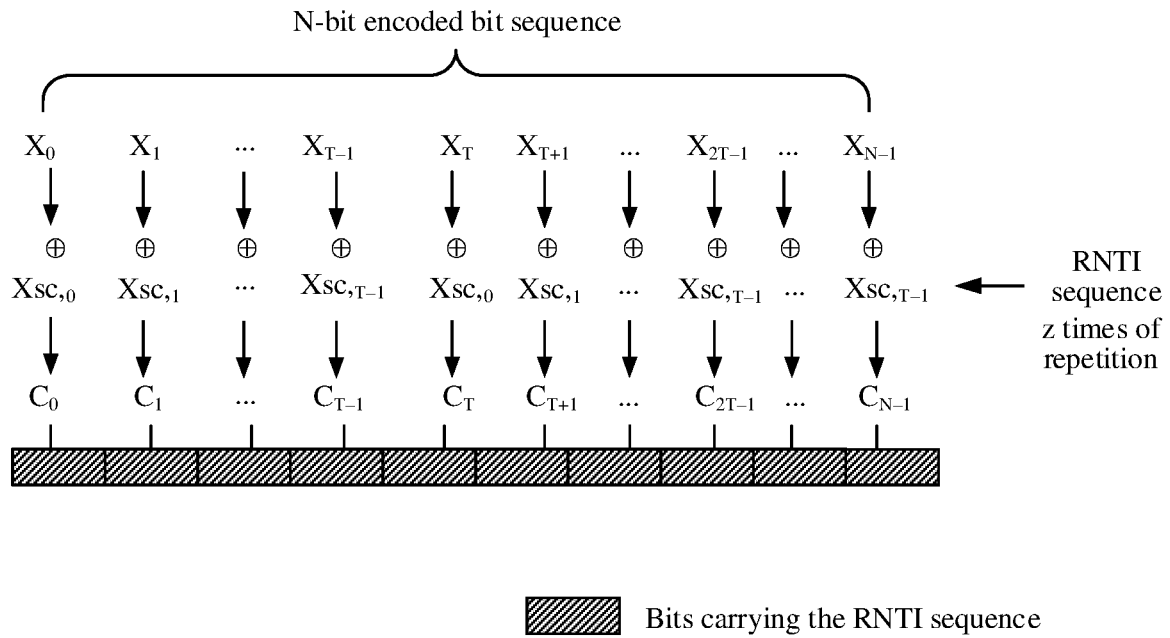
FIG. 8A is a fourth schematic diagram of an RNTI adding manner according to an embodiment.

As shown in FIG. 8A, N=zT, where z is a positive integer, and z>1. The base station sequentially scrambles the RNTI sequence having a length of T bits to all bit locations of the encoded bit sequence through z repetitions. For example, the encoded bit sequence is $\{X_0, X_1, \ldots, X_{T-1}, \ldots, X_T, X_{T+1}, \ldots, X_{2T-1}, \ldots, X_{N-1}\}$, and the RNTI sequence having the length of T bits is $\{Xsc_{,0}, Xsc_{,1}, \ldots, Xsc_{,T-1}\}$. The RNTI sequence having the length of T bits is sequentially scrambled to the sequence $\{X_0, X_1, \ldots, X_{T-1}, \ldots, X_T, X_{T+1}, \ldots, X_{2T-1}, \ldots, X_{N-1}\}$ through z repetitions. For example, $\{Xsc_{,0}, Xsc_{,1}, \ldots, Xsc_{,T-1}, Xsc_{,0}, Xsc_{,1}, \ldots, Xsc_{,T-1}, \ldots, Xsc_{,T-1}\}$ is scrambled to the sequence $\{X_0, X_1, \ldots, X_{T-1}, \ldots, X_T, X_{T-1}, \ldots, X_{2T-1}, \ldots, X_{N-1}\}$, to generate a sequence $\{C_0, C_1, \ldots, C_{T-1}, C_T, C_{T+1}, \ldots, C_{2T-1}, \ldots, C_{N-1}\}$.

Figure 8B:
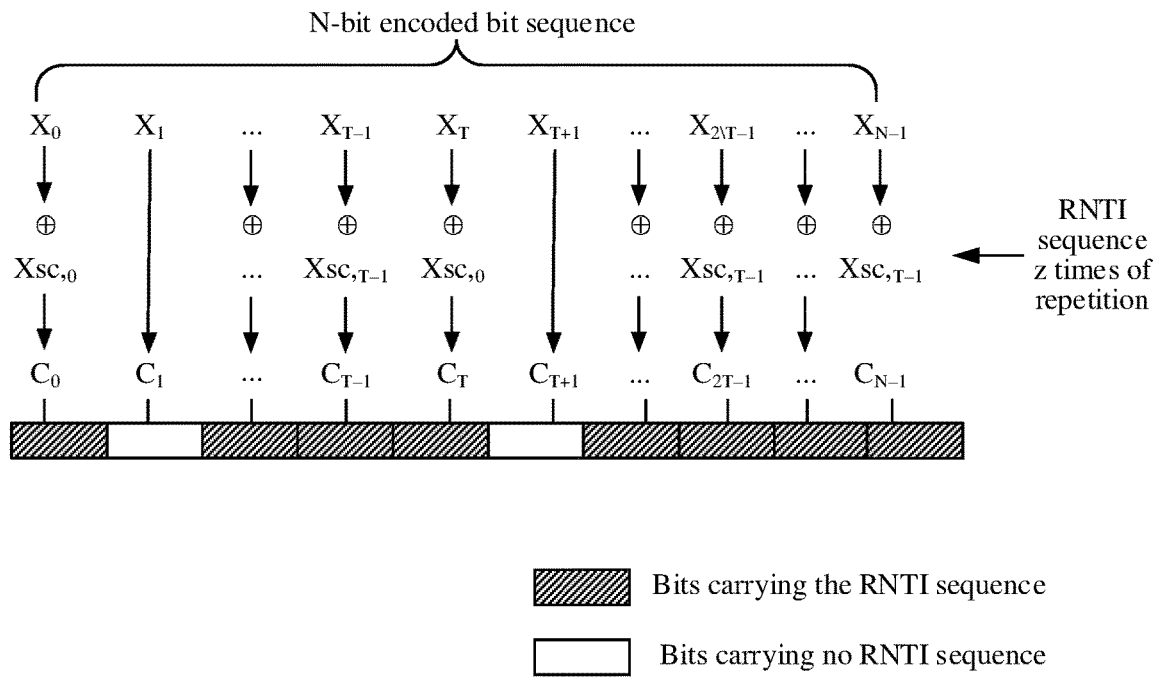
FIG. 8B is a fifth schematic diagram of an RNTI adding manner according to an embodiment.

Based on the scrambling manner in FIG. 8A, as shown in FIG. 8B, the base station may further sequentially scramble the RNTI sequence having a length of T bits to some bit locations of the encoded bit sequence through z repetitions. For example, the encoded bit sequence is $\{X_0, X_1, \ldots, X_{T-1}, \ldots, X_T, X_{T+1}, \ldots, X_{2T-1}, \ldots, X_{N-1}\}$, and the RNTI sequence having the length of T bits is $\{Xsc_{,0}, Xsc_{,1}, Xsc_{,2}, \ldots, Xsc_{,T-1}\}$. The RNTI sequence having the length of T bits is sequentially scrambled to the sequence $\{X_0, X_1, \ldots, X_{T-1}, \ldots, X_T, X_{T+1}, \ldots, X_{2T-1}, \ldots, X_{N-1}\}$ through z repetitions. For example, $\{Xsc_{,0}, Xsc_{,1}, \ldots, Xsc_{,T-1}, Xsc_{,0}, Xsc_{,1}, \ldots, Xsc_{,T-1}, \ldots, Xsc_{,T-1}\}$ is scrambled to the sequence $\{X_0, X_1, \ldots, X_{T-1}, \ldots, X_T, X_{T+1}, \ldots, X_{2T-1}, \ldots, X_{N-1}\}$, to generate a sequence $\{C_0, C_1, \ldots, C_{T-1}, C_T, C_{T+1}, \ldots, C_{2T-1}, \ldots, C_{N-1}\}$. The sequence $\{C_0, C_1, \ldots, C_{T-1}, C_T, C_{T+1}, \ldots, C_{2T-1}, \ldots, C_{N-1}\}$ includes bits carrying the RNTI sequence and bits not carrying the RNTI sequence. Based on a requirement, any bit locations may be selected from $\{X_0, X_1, \ldots, X_{T-1}, \ldots, X_T, X_{T+1}, \ldots, X_{2T-1}, \ldots, X_{N-1}\}$.

FIG. 8A and FIG. 8B merely show examples of a mapping manner of repeatedly scrambling an identifier sequence. During exemplary implementations, any other mapping manner may be selected. For example, alternatively, only a part of the RNTI sequence may be selected for repetition. Details are not described again.

Figure 9:
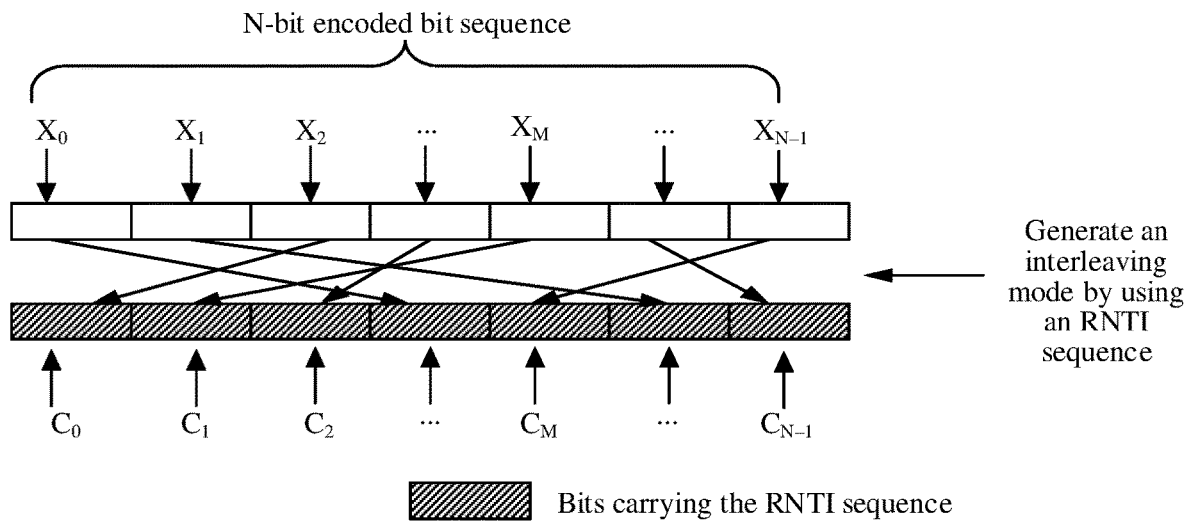
FIG. 9 is a sixth schematic diagram of an RNTI adding manner according to an embodiment.

As shown in FIG. 9, the base station performs an interleaving operation on the encoded bit sequence. An interleaving mode of the interleaving operation is generated by the RNTI sequence. For example, the encoded bit sequence is $\{X_0, X_1, X_2, \ldots, X_M, \ldots, X_{N-1}\}$, and the RNTI sequence having a length of T bits is $\{Xsc_{,0}, Xsc_{,1}, Xsc_{,2}, \ldots, Xsc_{,T-1}\}$. Bits not carrying the RNTI sequence are not shown in the figure. The interleaving mode is generated by using the RNTI sequence having the length of T bits. The interleaving operation is performed on the encoded bit sequence $\{X_0, X_1, X_2, \ldots, X_M, \ldots, X_{N-1}\}$ in the interleaving mode, to generate a sequence $\{C_0, C_1, C_2, \ldots, CM, \ldots, C_{N-1}\}$ carrying the RNTI sequence.

Figure 10:
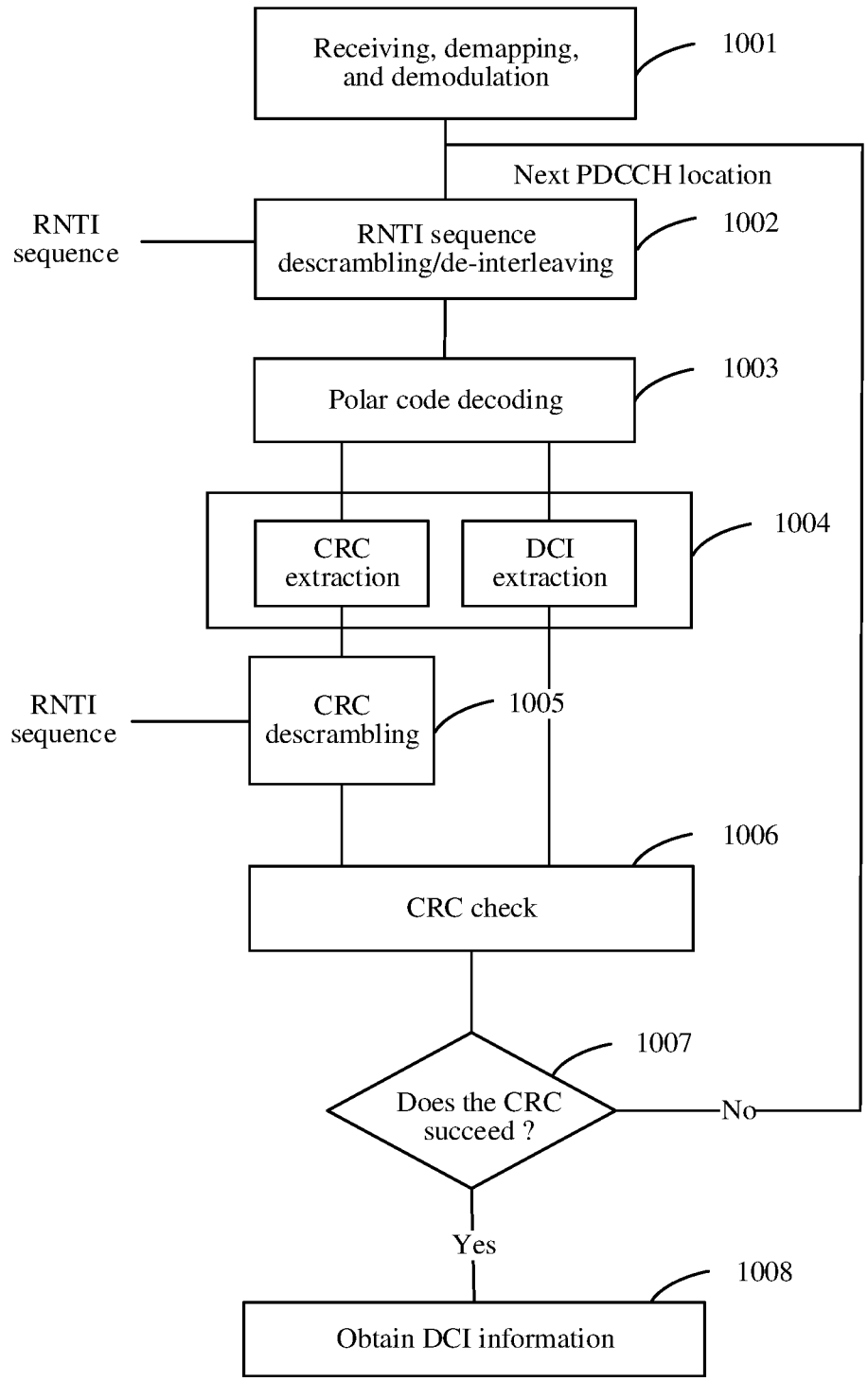
FIG. 10 is a schematic diagram of a PDCCH decoding process according to an embodiment.

Correspondingly, a PDCCH decoding process is shown in FIG. 10.

In step 1001, a terminal receives a polar code, and performs a demapping and demodulation process.

In step 1002, the terminal selects a PDCCH location, and the terminal performs a descrambling or de-interleaving operation on a demodulated bit sequence based on a determined manner of adding an RNTI sequence by a base station.

In step 1003, a polar code decoding operation is performed on a bit sequence obtained after the descrambling or de-interleaving operation.

In step 1004, CRC information bits and DCI information bits in the decoded polar code are extracted.

In step 1005, the extracted CRC information bits are descrambled. This step is an optional step. If the manner, determined by the terminal, of adding the RNTI sequence by the base station does not include a CRC bit scrambling operation, this step is omitted.

In step 1006, CRC check is performed on the decoded DCI information.

In step 1007, it is determined whether the CRC check succeeds; and if yes, step 1008 is performed; otherwise, a next PDCCH location is selected and step 1002 is performed.

In step 1008, the decoded DCI information is obtained, and the procedure is ended.

Therefore, the terminal performs descrambling or de-interleaving based on a unique identifier of the terminal in a determined manner of adding an identifier sequence by the base station, so as to better distinguish users.

Figure 11:
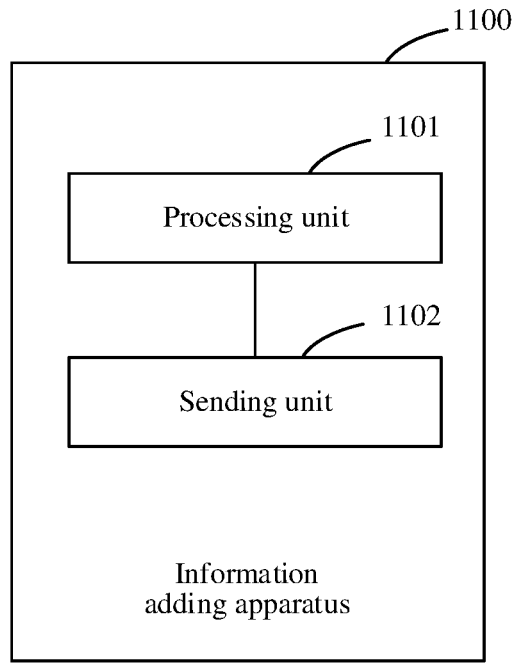
FIG. 11 is a schematic structural diagram of an information adding apparatus according to the embodiments.

Based on the same concept as the information adding method shown in FIG. 4, as shown in FIG. 11, an embodiment further provides an information adding apparatus 1100. The information adding apparatus 1100 is configured to perform the information adding method shown in FIG. 4. The information adding apparatus 1100 includes:

a processing unit 1101, configured to perform polar code encoding on a first bit sequence, to generate an encoded second bit sequence, where the processing unit 1101 is further configured to add a part or all of an identifier sequence to the second bit sequence, to generate a third bit sequence, where the identifier sequence is used to identify a terminal; and a sending unit 1102, configured to send the third bit sequence generated by the processing unit 1101.

Optionally, the processing unit 1101 is configured to perform a scrambling operation on the second bit sequence by using the part or all of the identifier sequence, to generate the third bit sequence.

Optionally, the processing unit 1101 is configured to perform the scrambling operation on a part or all of the second bit sequence by using the part or all of the identifier sequence.

Optionally, the processing unit 1101 is configured to scramble the second bit sequence by using the part or all of the identifier sequence based on a specified mapping relationship.

Optionally, the processing unit 1101 is configured to sequentially scramble the second bit sequence by using the part or all of the identifier sequence through several repetitions.

Optionally, the processing unit 1101 is configured to perform an interleaving operation on the second bit sequence in interleaving mode, to generate the third bit sequence, where the interleaving mode is determined by the part or all of the identifier sequence.

Optionally, the processing unit 1101 is further configured to: before performing the polar code encoding on the first bit sequence, obtain to-be-encoded information bits, and perform the check encoding on the information bits, to obtain check bits; add all of the identifier sequence to the check bits, or add a first part of the identifier sequence to the check bits; and generate the first bit sequence based on the information bits and the check bits carrying the identifier sequence.

Optionally, the processing unit 1101 is further configured to: add a second part of the identifier sequence to the second bit sequence if the first part of the identifier sequence is added to the check bit, where the first part differs from the second part, or the first part and the second part have an intersection set.

Figure 12:
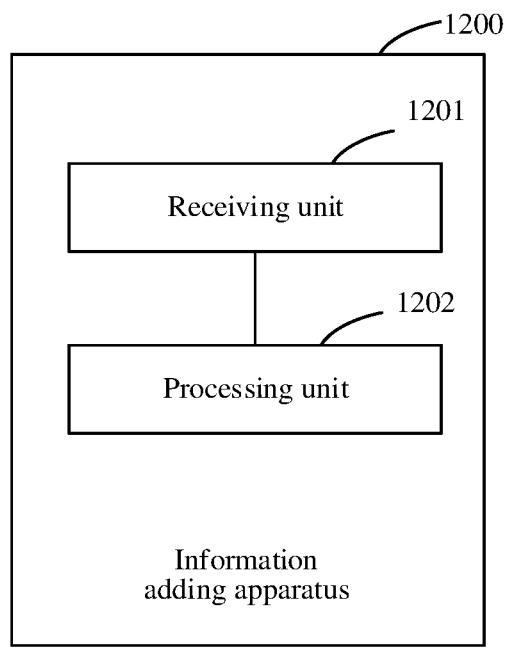
FIG. 12 is a schematic structural diagram of an information adding apparatus according to the embodiments.

Based on the same concept as the information adding method shown in FIG. 4, as shown in FIG. 12, an embodiment further provides an information adding apparatus 1200. The information adding apparatus 1200 is configured to perform the information adding method shown in FIG. 4. The information adding apparatus 1200 includes:

a receiving unit 1201, configured to obtain a to-be-decoded sequence; and a processing unit 1202, configured to perform, by using a part or all of an identifier sequence, a descrambling operation on the to-be-decoded sequence obtained by the receiving unit 1201; or perform, in interleaving mode, a de-interleaving operation on the to-be-decoded sequence obtained by the receiving unit 1201, where the interleaving mode is determined by the part or all of the identifier sequence, and the identifier sequence is used to identify a terminal, where the processing unit 1202 is further configured to perform polar code decoding on a sequence obtained after the descrambling operation or the de-interleaving operation.

Optionally, the processing unit 1202 is configured to perform the descrambling operation on a part or all of the to-be-decoded sequence by using the part or all of the identifier sequence.

Optionally, the processing unit 1202 is configured to perform, based on a specified mapping relationship, the descrambling operation on the to-be-decoded sequence by using the part or all of the identifier sequence.

Optionally, the processing unit 1202 is configured to sequentially perform, through several repetitions, the descrambling operation on the to-be-decoded sequence by using the part or all of the identifier sequence.

Optionally, the processing unit 1202 is further configured to extract check bits from the decoded sequence and perform a descrambling operation on the check bits by using the part or all of the identifier sequence.

Figure 13:
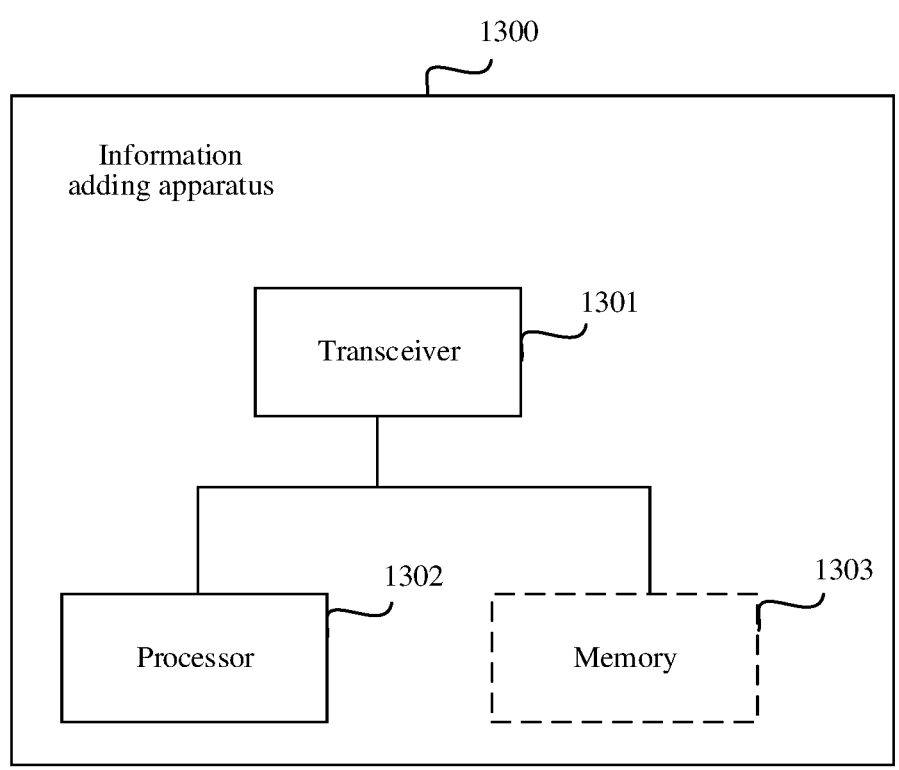
FIG. 13 is a schematic structural diagram of an information adding apparatus according to the embodiments.

Based on the same concept as the information adding method shown in FIG. 4, as shown in FIG. 13, an embodiment further provides an information adding apparatus 1300. The information adding apparatus 1300 may be configured to perform the method shown in FIG. 4. The information adding apparatus 1300 includes a transceiver 1301 and a processor 1302. The processor 1302 is configured to execute a set of code. When the code is executed, the execution enables the processor 1302 to perform the information adding method shown in FIG. 4. Optionally, the information adding apparatus 1300 may further include a memory 1303, configured to store the code executed by the processor 1302. Optionally, the memory 1303 may be integrated with the processor 1302.

The processor 1302 may be a central processing unit (CPU), a network processor, or a combination of a CPU and a network processor.

The processor 1302 may further include a hardware chip. The foregoing hardware chip may be an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof.

The memory 1303 may include a volatile memory, such as a random-access memory (RAM). Alternatively, the memory 1303 may include a non-volatile memory, such as a flash memory, a hard disk drive (HDD), or a solid-state drive (SSD). Alternatively, the memory 1303 may include a combination of the foregoing types of memories.

Figure 14:
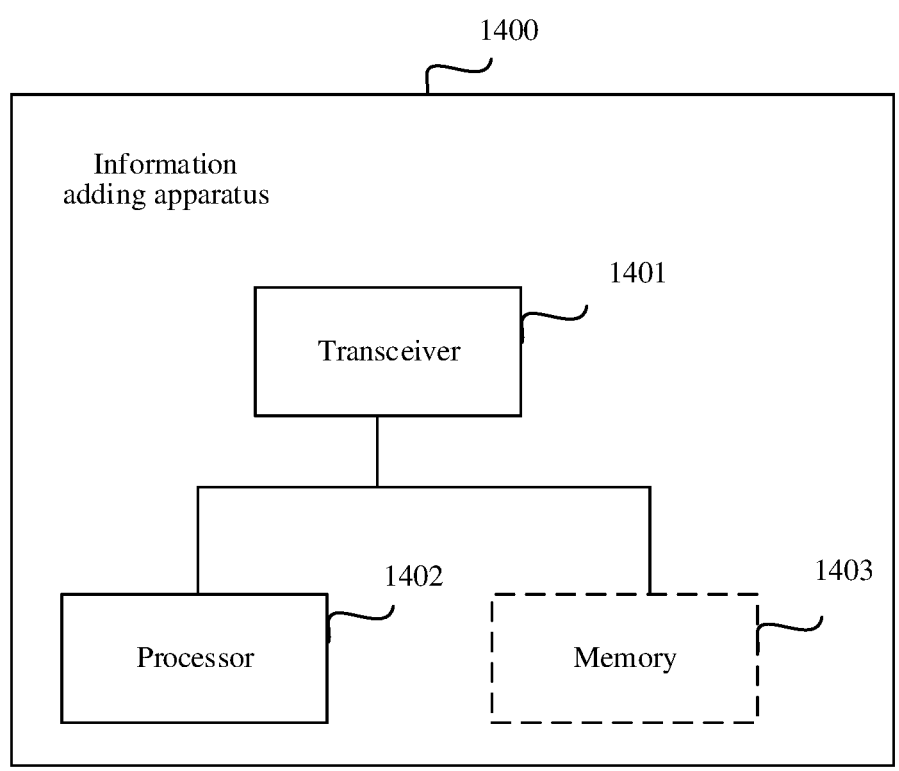
FIG. 14 is a schematic structural diagram of an information adding apparatus according to the embodiments.

Based on the same concept as the information adding method shown in FIG. 4, as shown in FIG. 14, an embodiment further provides an information adding apparatus 1400. The information adding apparatus 1400 may be configured to perform the method shown in FIG. 4. The information adding apparatus 1400 includes a transceiver 1401 and a processor 1402. The processor 1402 is configured to execute a set of code. When the code is executed, the execution enables the processor 1402 to perform the information adding method shown in FIG. 4. Optionally, the information adding apparatus 1400 may further include a memory 1403, configured to store the code executed by the processor 1402. Optionally, the memory 1403 may be integrated with the processor 1402.

The processor 1402 may be a CPU, a network processor, or a combination of a CPU and a network processor.

The processor 1402 may further include a hardware chip. The foregoing hardware chip may be an ASIC, a PLD, or a combination thereof. The PLD may be a CPLD, an FPGA, a GAL, or any combination thereof.

The memory 1403 may include a volatile memory, for example, a RAM. The memory 1403 may alternatively include a non-volatile memory, for example, a flash memory, an HDD, or an SSD. The memory 1403 may alternatively include a combination of the foregoing types of memories.

It should be noted that the apparatuses provided in FIGS. 13 and 14 may be configured to implement the information adding method shown in FIG. 4. In an exemplary implementation, the processing unit 1101 in FIG. 11 may be implemented by the processor 1302 in FIG. 13, and the sending unit 1102 may be implemented by the transceiver 1301 in FIG. 13. The processing unit 1202 in FIG. 12 may be implemented by the processor 1402 in FIG. 14, and the receiving unit 1201 may be implemented by the transceiver 1401 in FIG. 14.

An embodiment provides a computer storage medium, configured to store a computer program. The computer program includes an instruction used to perform the information adding method shown in FIG. 4.

An embodiment provides a computer program product including an instruction. When the computer program product is run on a computer, the computer is enabled to perform the information adding method shown in FIG. 4.

Figure 15:
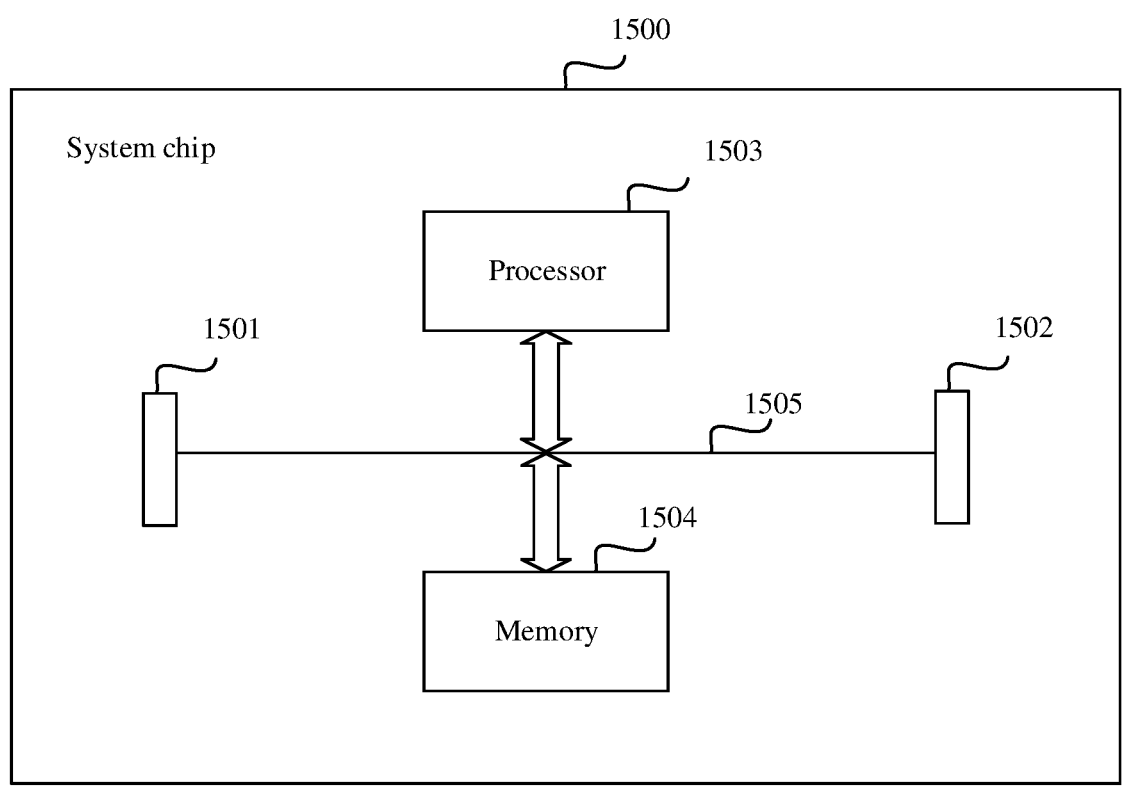
FIG. 15 is a schematic structural diagram of a system chip according to an embodiment.

Based on the same concept as the information adding method shown in FIG. 4, as shown in FIG. 15, an embodiment further provides a system chip 1500. The system chip 1500 includes an input interface 1501, an output interface 1502, at least one processor 1503, and a memory 1504. The input interface 1501, the output interface 1502, the processor 1503, and the memory 1504 are connected to each other by using a bus 1505. The processor 1503 is configured to execute code in the memory 1504. When the code is executed, the processor 1503 implements the method performed by the base station in FIG. 4. The bus 1505 may be omitted sometimes, for example, when other modules are all implemented by logic circuits or hardware circuits.

The system chip 1500 shown in FIG. 15 can implement processes implemented by the base station in the method embodiment in FIG. 4. To avoid repetition, details are not described herein again.

A person of ordinary skill in the art should understand that the embodiments may be provided as a method, a system, or a computer program product. Therefore, an embodiment may use a form of hardware only embodiments, software only embodiments, or embodiments with a combination of software and hardware. Moreover, an embodiment may use a form of a computer program product that is implemented on one or more computer-usable storage media (including but not limited to a disk memory, a CD-ROM, an optical memory, and the like) that include computer usable program code.

The embodiments are described with reference to the flowcharts and/or block diagrams of the method, the device (system), and the computer program product according to the embodiments. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a special-purpose computer, an embedded processor, or a processor of another programmable data processing device to generate a machine, so that the instructions executed by a computer or a processor of another programmable data processing device generate an apparatus for implementing a specific function in one or more processes in the flowcharts and/or in one or more blocks in the block diagrams.

These computer program instructions may be stored in a computer readable memory that can instruct the computer or another programmable data processing device to work in a specified manner, so that the instructions stored in the computer readable memory generate an artifact that includes an instruction apparatus. The instruction apparatus implements a function in one or more processes in the flowcharts and/or in one or more blocks in the block diagrams.

These computer program instructions may also be loaded onto a computer or another programmable data processing device, so that a series of operations and steps are performed on the computer or the other programmable device, thereby generating computer-implemented processing. Therefore, the instructions executed on the computer or the other programmable device provide steps for implementing a function in one or more processes in the flowcharts and/or in one or more blocks in the block diagrams.

A person of ordinary skill in the art can make various modifications and variations to the embodiments without departing from the scope of the embodiments. The embodiments are intended to cover these modifications and variations provided that they fall within the scope of protection defined by the following claims and their equivalent technologies.

What is claimed is:

1. An information adding method, comprising:
   obtaining, by a transmit end, to-be-encoded information bits and
   performing check encoding on the information bits to obtain check bits;
   adding, by the transmit end, all of an identifier sequence to the check bits or
   adding, by the transmit end, a first part of the identifier sequence to the check bits;
   generating, by the transmit end, a first bit sequence based on the information bits and the check bits carrying the identifier sequence;
   performing, by the transmit end, polar code encoding on the first bit sequence to generate an encoded second bit sequence;
   adding, by the transmit end, a part or all of the identifier sequence to the second bit sequence to generate a third bit sequence,
   wherein the identifier sequence is used to identify a terminal; and
   outputting, by the transmit end, the third bit sequence,
   wherein determining that the transmit end adds the first part of the identifier sequence to the check bits, the adding, by the transmit end, of the part or all of the identifier sequence to the second bit sequence comprises:
adding, by the transmit end, a second part of the identifier sequence to the second bit sequence, wherein the first part differs from the second part, or the first part and the second part have an intersection set.

2. The method according to claim 1, wherein the adding, by the transmit end, of the part or all of the identifier sequence to the second bit sequence to generate a third bit sequence comprises:
performing, by the transmit end, a scrambling operation on the second bit sequence by using the part or all of the identifier sequence;
to generate the third bit sequence.

3. The method according to claim 2, wherein the performing, by the transmit end, of the scrambling operation on the second bit sequence by using the part or all of the identifier sequence comprises:
performing, by the transmit end, the scrambling operation on a part or all of the second bit sequence by using the part or all of the identifier sequence.

4. The method according to claim 2, wherein the performing, by the transmit end, of the scrambling operation on the second bit sequence by using the part or all of the identifier sequence comprises:
scrambling, by the transmit end, the second bit sequence by using the part or all of the identifier sequence based on a specified mapping relationship.

5. The method according to claim 4, wherein the scrambling, by the transmit end, of the second bit sequence by using the part or all of the identifier sequence based on a specified mapping relationship comprises:
sequentially scrambling, by the transmit end, the second bit sequence by using the part or all of the identifier sequence through several times of repetition.

6. The method according to claim 1, wherein the adding, by the transmit end, of the part or all of the identifier sequence to the second bit sequence to generate a third bit sequence comprises:
performing, by the transmit end, an interleaving operation on the second bit sequence in interleaving mode to generate the third bit sequence,
wherein the interleaving mode is determined by the part or all of the identifier sequence.

7. An information adding apparatus, comprising:
a non-volatile memory, configured to store an instruction; and a processor, configured to execute the instruction to:
obtain to-be-encoded information bits, and perform check encoding on the information bits, to obtain check bits;
add all of an identifier sequence to the check bits, or add a first part of the identifier sequence to the check bits;
generate a first bit sequence based on the information bits and the check bits carrying the identifier sequence;
perform polar code encoding on the first bit sequence to generate an encoded second bit sequence;
add a part or all of an identifier sequence to the second bit sequence to generate a third bit sequence,
wherein the identifier sequence is used to identify a terminal; and
output the third bit sequence; and
add a second part of the identifier sequence to the second bit sequence determining that the processing unit adds the first part of the identifier sequence to the check bits, wherein the first part differs from the second part, or the first part and the second part have an intersection set.

8. The apparatus according to claim 7, wherein the adding of the part or all of the identifier sequence to the second bit sequence comprises:
performing a scrambling operation on the second bit sequence by using the part or all of the identifier sequence, to generate the third bit sequence.

9. The apparatus according to claim 8, wherein the scrambling comprises:
performing the scrambling operation on the part or all of the second bit sequence by using the part or all of the identifier sequence.

10. The apparatus according to claim 8, wherein the scrambling comprises:
scrambling the second bit sequence by using the part or all of the identifier sequence based on a specified mapping relationship.

11. The apparatus according to claim 10, wherein the scrambling comprises:
sequentially scrambling the second bit sequence by using the part or all of the identifier sequence through several repetitions.

12. The apparatus according to claim 7, wherein the processor is further configured to:
perform an interleaving operation on the second bit sequence in interleaving mode to generate the third bit sequence,
wherein the interleaving mode is determined by the part or all of the identifier sequence.

13. A computer readable non-transitory storage medium, configured to store a computer program, wherein the computer program comprises an instruction, wherein the instruction causes an information adding apparatus to:
obtain to-be-encoded information bits, and perform check encoding on the information bits, to obtain check bits;
add all of an identifier sequence to the check bits, or add a first part of the identifier sequence to the check bits;
generate the first bit sequence based on the information bits and the check bits carrying the identifier sequence;
perform polar code encoding on the first bit sequence to generate an encoded second bit sequence;
add a part or all of the identifier sequence to the second bit sequence to generate a third bit sequence,
wherein the identifier sequence is used to identify a terminal; and
output the third bit sequence; and
add a second part of the identifier sequence to the second bit sequence determining that the processing unit adds the first part of the identifier sequence to the check bits, wherein the first part differs from the second part, or the first part and the second part have an intersection set.

14. The computer readable non-transitory storage medium according to claim 13, wherein the adding of the part or all of the identifier sequence to the second bit sequence to generate a third bit sequence comprises:
performing a scrambling operation on the second bit sequence by using the part or all of the identifier sequence, to generate the third bit sequence.

15. The computer readable non-transitory storage medium according to claim 14, wherein the performing of the scrambling operation on the second bit sequence by using the part or all of the identifier sequence comprises:

performing the scrambling operation on a part or all of the second bit sequence by using the part or all of the identifier sequence.

16. The computer readable non-transitory storage medium according to claim 14, wherein the performing of the scrambling operation on the second bit sequence by using the part or all of the identifier sequence comprises:

scrambling the second bit sequence by using the part or all of the identifier sequence based on a specified mapping relationship.

* * * * *